United States Patent [19]

Chambers et al.

[11] Patent Number: 4,824,767
[45] Date of Patent: Apr. 25, 1989

[54] DUAL GLASS CONTACT PROCESS

[75] Inventors: Stephen T. Chambers, Hillsboro, Oreg.; Stephen T. Luce, Underhill, Vt.

[73] Assignee: Intel Corporation, Santa Clara, Calif.

[21] Appl. No.: 57,240

[22] Filed: Jun. 2, 1987

Related U.S. Application Data

[63] Continuation of Ser. No. 817,523, Jan. 9, 1986, abandoned.

[51] Int. Cl.⁴ .................................................. G03C 5/00
[52] U.S. Cl. .................................... 430/313; 430/314; 430/316; 430/317; 430/329; 430/330; 156/643; 156/653; 437/227
[58] Field of Search ............... 430/313, 316, 317, 323, 430/327, 330, 329, 314; 156/643, 653; 437/189, 229

[56] References Cited

U.S. PATENT DOCUMENTS 4,508,815  4/1985  Ackmann et al. ................. 430/314

Primary Examiner—José G. Dees
Attorney, Agent, or Firm—Blakely, Sokoloff, Taylor & Zafman

[57] ABSTRACT

A method for forming contact openings in semiconductor devices. In borosilicate glass layers deposited over the gate and drain area of a device, followed by a borophosphosilicate glass layer. After masking with photoresist and defining openings, the borophosphosilicate glass is isotropically etched to undercut the resist layer. A plasma etch is utilized to anisotropically etch the borosilicate glass layer and expose the surface of the drain area. After the photoresist is stripped away, a reflow step is employed to reduce the sharp edges of the glass layer and result in a sloped contact opening profile. Good metal coverage is achieved while maintaining isolation of the gate.

16 Claims, 4 Drawing Sheets

FIG_1
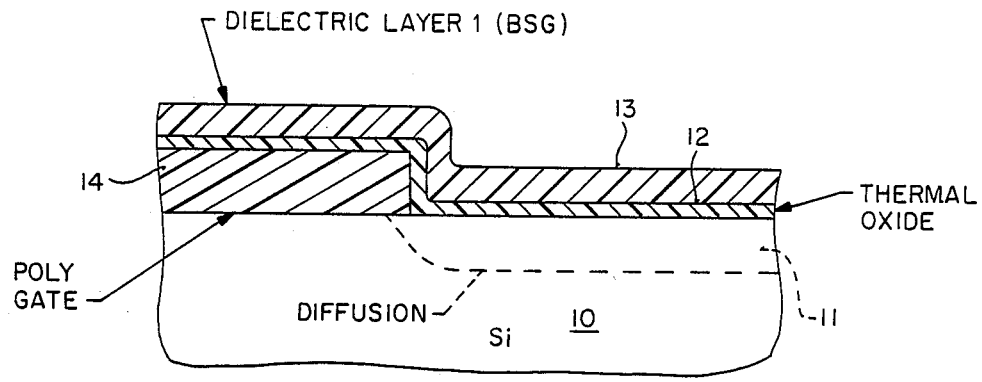
FIG_2
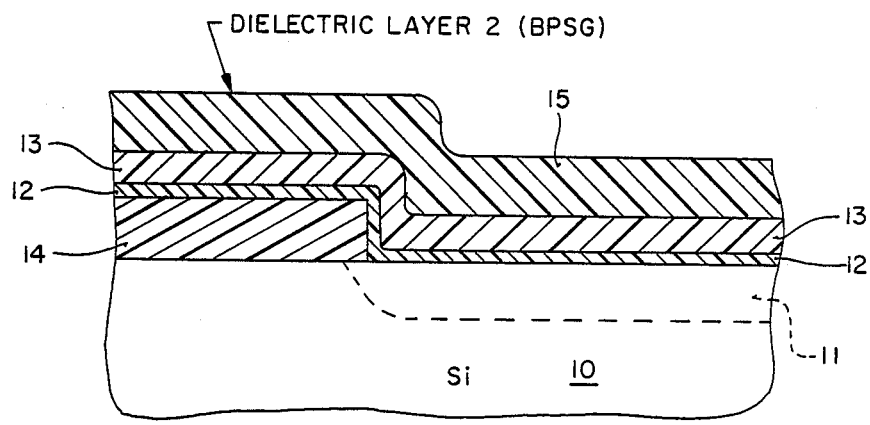
FIG_3
DIELECTRIC LAYER 2 REFLOWED
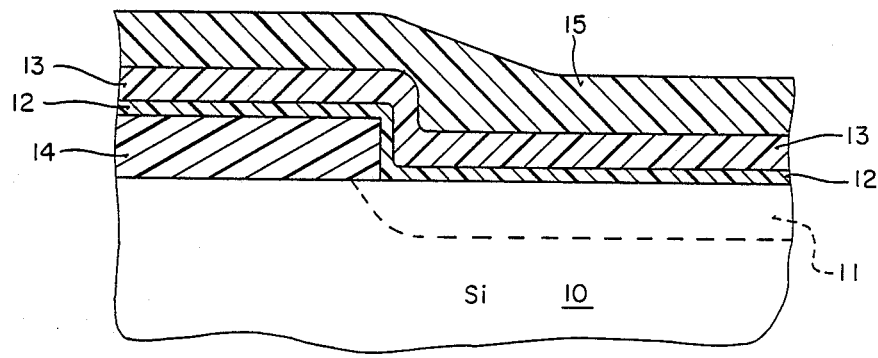

FIG_4
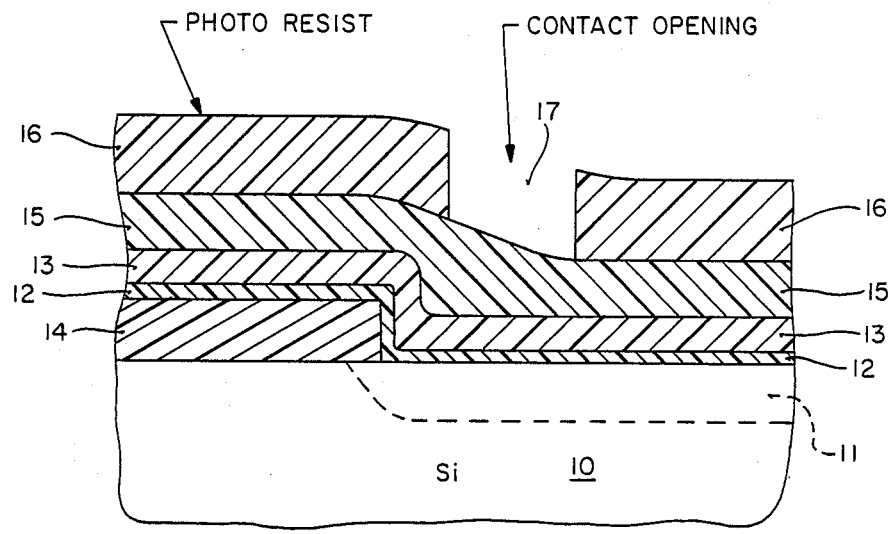
FIG_5
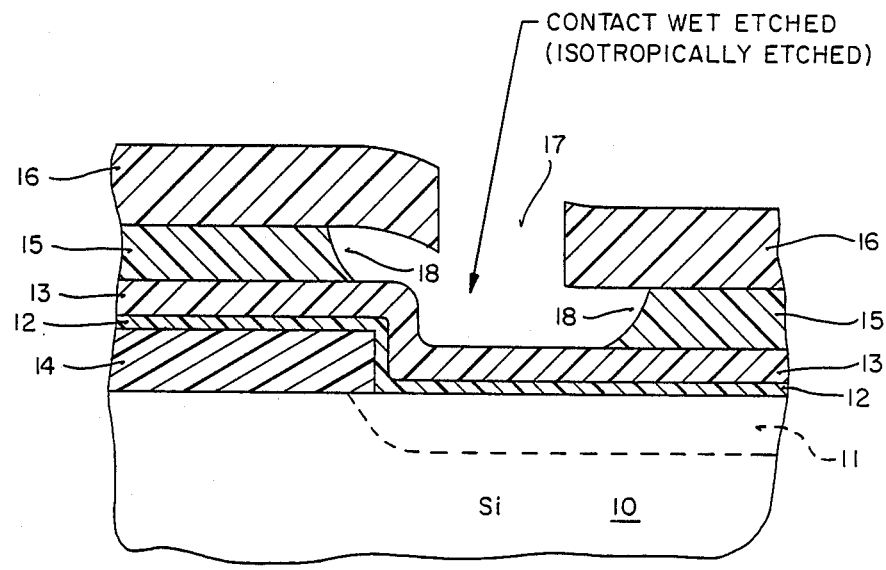

FIG_6
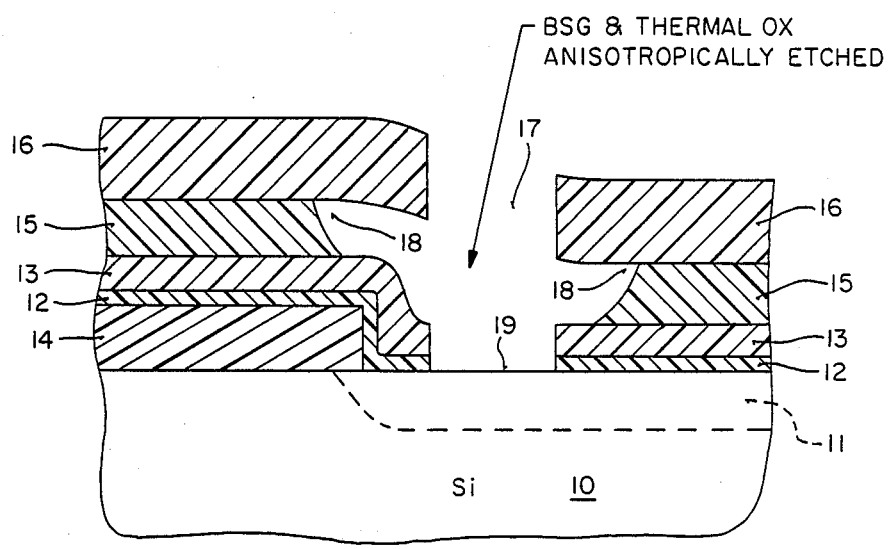
BSG & THERMAL OX ANISOTROPICALLY ETCHED
FIG_7
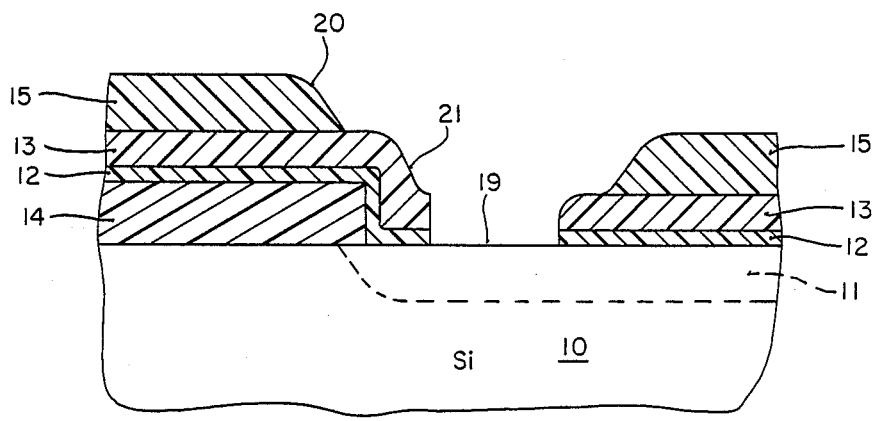

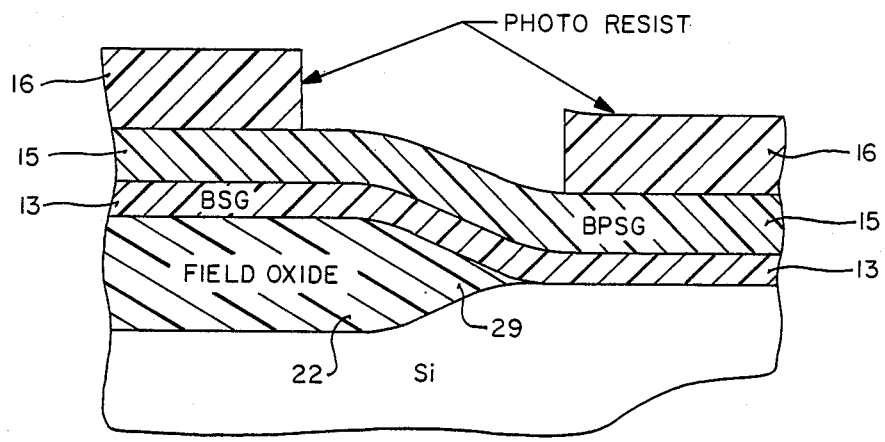
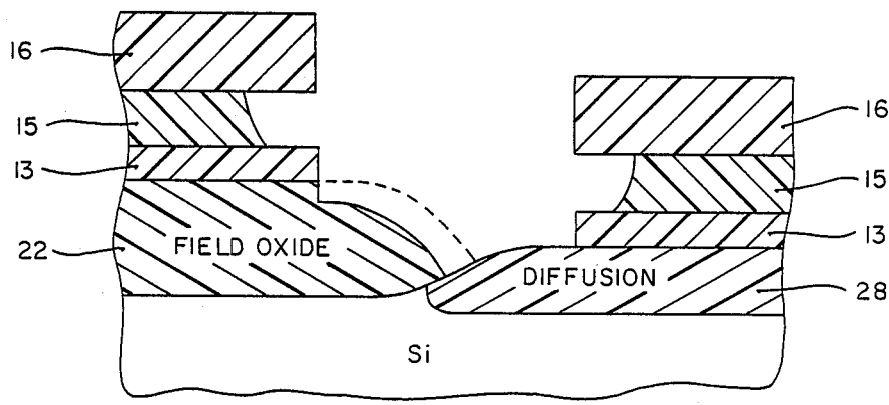
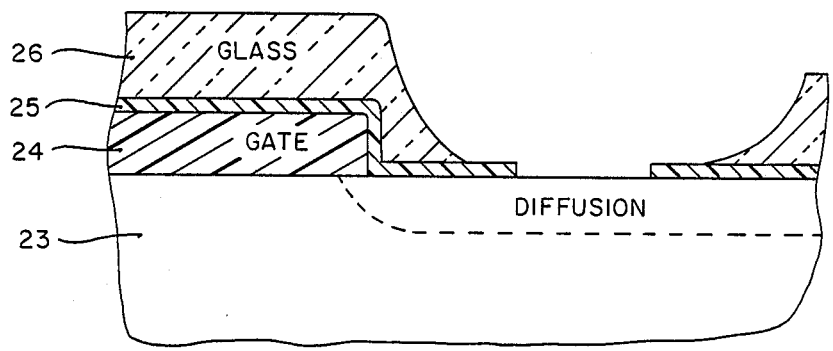

DUAL GLASS CONTACT PROCESS

This is a continuation of application Ser. No. 817,523 filed Jan. 9, 1986, abandoned.

BACKGROUND OF THE INVENTION

1. Field of the Invention

This invention relates to the field of forming contacts and contact openings for semiconductor devices.

2. Prior Art

In the processing of semiconductor devices, it is desired to form conductive pads to make contact to the devices. Particularly with transistors, the gate, source and drain must all have contacts. Typically, transistors are three-dimensional with the gate area higher than the surrounding source/drain area. In order to reduce coupling capacitance and prevent shorting of metallurgy to source, drain, and gate regions, the entire device is covered with an insulative dielectric layer. Openings are then formed in this insulative layer over the source of drain and gate and a metal layer is formed therein for contacts.

In the prior art process, the gate, source and drain areas of a field effect transistor are reoxidized. Then a layer of phosphorus doped glass is deposited. The doped glass is subjected to a thermal cycle so that it reflows to smooth corners for good metal coverage. Contacts are then patterned using standard photolithographic techniques. The phosphorus doped glass is wet etched and the thermally grown oxide is anisotropically dry etched. In this prior art process the contacts must be placed sufficiently away from the gate so as to prevent exposing the thermal oxide on a gate to the isotropic wet etch. If the thermal oxide is exposed by the wet etch, it is not sufficient to insulate the gate from the metal.

Therefore, it is an object of the present invention to provide a means of forming a contact opening which results in a gradual slope between elevations.

It is a further object of the present invention to provide a means of forming contacts near gates which still result in contact isolation and without a large increase in the required oxide to silicon etch selectivity.

SUMMARY OF THE PRESENT INVENTION

A dual glass layer is used to provide insulation between a gate of a transistor and a source or drain contact. A layer of borosilicate glass is deposited on the device. Next a layer of borophosphosilicate glass is deposited. A reflow step is performed at approximately 920° C. to smooth the profile of the glass layers. A photoresist layer is applied and openings defined over the contact area. A wet etch is performed which isotropically etches the borophosphosilicate glass and undercuts the photoresist. An anisotropic plasma etch then is used to form an opening through the borosilicate glass to the underlying silicon. The photoresist is stripped and a second reflow step is performed to provide a gradual profile for the contact opening. The result is a contact opening which permits good metal coverage and aggressive design tolerances.

BRIEF DESCRIPTION OF THE DRAWINGS

FIG. 1 illustrates a cross-sectional view of a transistor illustrating the gate and drain and having a first dielectric layer formed thereon.

FIG. 2 illustrates the body of FIG. 1 after a second dielectric layer has been formed thereon.

FIG. 3 illustrates the body of FIG. 2 after a reflow step has been performed.

FIG. 4 illustrates the body of FIG. 3 after a photoresist layer has been formed and openings have been defined.

FIG. 5 illustrates the body of FIG. 4 after the second dielectric layer has been etched.

FIG. 6 illustrates the body of FIG. 5 after the first dielectric layer has been etched.

FIG. 7 illustrates the body of FIG. 6 after the remaining photoresist has been stripped and a second reflow step has been taken place.

FIG. 8 illustrates a step in the formation of a contact near a field oxide region.

FIG. 9 illustrates the body of FIG. 8 after the contact opening has been formed.

FIG. 10 illustrates a contact opening formed by prior art methods.

DETAILED DESCRIPTION OF THE PRESENT INVENTION

An improved process for forming contacts to semiconductor devices is described. A dual glass layer provides a gradual profile for improved metal coverage while still providing adequate insulating capability. In the following description, numerous specific details are set forth such as etch rates, process temperatures, etc., in order to provide a more thorough understanding of the present invention. It will be obvious however, to one skilled in the art, that the present invention may be practiced without these specific details. In other instances, well-known steps have not been described in detail in order not to unnecessarily obscure the present invention.

In order to achieve high density in device fabrication, it is necessary to be able to place the contacts close to the edge of the conductors. For example, placing the drain contact of a transistor very near the gate area of the transistor would aid in high density fabrication. In order to achieve this, an insulative layer is formed over the gate and drain area. Openings are formed over the drain area in the insulative layer where a metal layer is deposited to provide a contact. An example of a contact opening formed by prior art methods is illustrated in FIG. 10. A gate 24 is disposed on a silicon substrate 23. A layer of thermally grown oxide 25 covers the gate and silicon substrate. A doped glass layer 26 is deposited on the surface of the device. The doped glass is reflowed to smooth the corners. Contacts are then patterned using standard photolithographic techniques. The doped glass is wet etched and the thermally grown oxide is dry etched. A problem arises if the contact is placed close to the gate because the wet etch exposes the thermally grown oxide. The thermally grown oxide alone is not sufficient to insulate the gate from the metal that is deposited in the contacts. This results in a limitation of the minimum contact to gate space.

In order to overcome the disadvantages of the prior art methods, the present invention utilizes a dual glass process as shown in FIGS. 1 through 7. The device shown includes a polysilicon gate 14, a diffused drain area 11, and a silicon substrate 10. In the preferred embodiment of the present invention, a thin thermal oxide layer 12 is first grown over the gate and drain to provide added isolation between the drain contact and the gate. Next a dielectric layer 13 is formed on the device.

This layer must be permeable to hydrogen so that alloying of damage caused by other processing steps can be accomplished. In addition, the layer 13 should have a low dielectric constant near that of the thermal oxide layer. In addition, this first layer 13 should have a high reflow temperature. In the preferred embodiment of the present invention borosilicate glass (BSG) is used. In the present application in the BSG is 4 weight percent boron and is deposited by chemical vapor deposition. This first layer of BSG is approximately 0.4 microns thick.

Next, as shown in FIG. 2, a second dielectric layer 15 is deposited over the first. This layer should have dielectric properties similar to the first layer and also be permeable to hydrogen. However, it is necessary that this dielectric layer 15 have a reflow temperature lower than that of the first dielectric layer 13. In the preferred embodiment of the present invention the second layer 15 is borophosphosilicate glass (BPSG), deposited by chemical vapor deposition. In the present application, the BPSG is 2 weight percent boron and 7 weight percent phosphorus. BPSG has a reflow temperature of approximately 920° C.

Next, a first reflow step is done by heating the device for approximately 10 minutes at 920° C. In the preferred embodiment the heating is done in steam. As a result, the profile of the second dielectric layer 15 is as shown in FIG. 3. A gradual slope between the gate area and the drain area of layer 15 is achieved.

A photoresist layer 16 of FIG. 4 is deposited over the BPSG layer 15. Using standard photolithography techniques, a contact opening 17 is defined in the photoresist layer.

At this point the BPSG layer 15 is etched away at the contact opening as shown in FIG. 5. This etch step should be isotropic so that undercutting of the photoresist layer such as at regions 18 of FIG. 5 results. In the preferred embodiment of the present invention a wet etch using 6 to 1 BHF for 5 minutes is employed. It is necessary that the etching rate of the BPSG layer 15 be faster than the BSG layer 13. This first etching step should not substantially effect the lower BSG layer. In the present invention, BSG has an etch rate of approximately 6 angstroms per second in 6 to 1 BHF while the BPSG has an etch rate of approximately 30 angstroms per second in 6 to 1 BHF (23° C.). Thus the etch rate of the BPSG layer 15 is approximately 5 times the etch rate of the BSG layer 13.

The BSG layer 13 and the thermal oxide layer 12 are then anisotropically etched in a dry (plasma) etch. In this manner, the contact opening 19 of FIG. 6 is in substantial alignment with the photoresist opening 17. It is important that this etch be anisotropic so that aggressive design parameters can be utilized. The thickness of the BSG layer at area 21 (near the corner of the gate) is not substantially effected by this second etch step so that an adequate insulating layer is maintained.

Next, the photoresist layer is stripped away and a second reflow step takes place to provide a better profile for metal coverage. This second reflow step is performed in nitrogen in the preferred embodiment at approximately 920° C. for approximately 10 minutes. This results in the profile as shown in FIG. 7. Because the reflow temperature of the BSG layer 13 is higher than that of BPSG layer 15, there is no substantial thinning of layer 13 at critical area 21. However, at area 20 of layer 15 the second reflow step results in a gradual profile.

Finally, the metal layer is deposited in the contact opening. Good metal coverage is achieved because of the gentle two step contact profile, and adequate insulation between the gate and the metal layer is maintained.

In an alternate embodiment of the present invention, a thermostabilization step is employed following the deposition of the BSG layer 13. In this embodiment, the devices are heated to 920° C. for approximately 5 minutes in order to densify the BSG film and prevent the possible moisture absorption problems. When the thermostabilization step is not employed, the BSG and BPSG layers can be applied in a single sequential step.

The method of forming contacts of the present invention is also advantageously employed when forming contact openings at a junction which is next to field oxide region. An example is shown in FIGS. 8 and 9. In FIG. 8 a BSG layer 13 and BPSG layer 15 have been formed on a silicon substrate which includes the field oxide region 22. The field oxide region includes a "birds beak" region 29, a tapered extension of the oxide along the substrate. A photoresist layer 16 is formed thereon and an opening is defined. After isotropically etching the first BPSG layer 15 so that undercutting of the photoresist occurs, as shown in FIG. 9, the lower BSG layer 13 is anisotropically plasma etched. In the past, etching all the field oxide could result in an electrical short of the underlying substrate to the diffusion. In the prior art this was avoided by disallowing placement of the contact over the field oxide. (The contact opening would extend only to the dotted line of FIG. 9.) As a result of the improved oxide thickness uniformity achieved with the dual glass process less field oxide is removed in the present process, permitting the contact to overlap the field oxide. A reflow step is then employed to ease the profile of the glass layers. Finally, a metal layer is formed in the opening to provide contact to the diffusion 28.

Thus, an improved method for forming contact openings in semi-conductor devices has been described. By using a dual glass layer for insulation, a gently sloping profile is achieved without sacrificing insulating capabilities.

We claim:

1. An improved method of providing insulated contact openings having sloped two step profiles on a semiconductor body comprising the steps of:

forming a first dielectric layer on said body, said first dielectric layer having a first reflow temperature, said first dielectric layer being permeable to hydrogen;

forming a second dielectric layer on said first dielectric layer, said second dielectric layer having a second reflow temperature lower than said first reflow temperature;

heating said body to said second reflow temperature;

forming a photoresist layer on said second dielectric layer and forming openings in said photoresist layer to expose portions of said second dielectric layer utilizing a photolithographic means;

removing said exposed portions of said second dielectric layer to expose portions of said first dielectric layer by an isotropic etching process;

removing said exposed portions of said first dielectric layer to expose portions of said body by an anisotropic etching process;

removing said photoresist layer;

heating said body to said second reflow temperature;

whereby an improved insulated contact opening having a sloped, two step profile is realized.

2. The method as defined by claim 1 wherein said first dielectric layer is borosilicate glass.

3. The method as defined by claim 1 wherein said second layer comprises borophosphosilicate glass.

4. The method as defined by claim 1 wherein said second reflow temperature is approximately 920° C.

5. A method of forming contacts on a semiconductor body, where the contacts are embedded in contact openings having sloped two step profiles, comprising the steps of:
   forming a first dielectric layer on said body, said first dielectric layer having a first reflow temperature and a first etch rate, said first dielectric layer being permeable to hydrogen;
   forming a second dielectric layer on said first dielectric layer, said second dielectric layer having a second reflow temperature and a second etch rate, said second reflow temperature lower than said first reflow temperature, said second etch rate higher than said first etch rate;
   heating said body to said second reflow temperature;
   forming a photoresist mask layer on said second dielectric layer;
   defining openings in said mask layer to expose said second dielectric layer utilizing a photolithographic means;
   removing said exposed portions of said second dielectric layer to expose said first dielectric layer by an isotropic etching process;
   removing said exposed portions of said first dielectric layer to expose said body by an anisotropic etching process;
   removing said mask layer;
   heating said body to said second reflow temperature;
   forming a conductive layer on said exposed portions of said body;
   whereby an improved contact is realized.

6. The method as defined by claim 5 wherein said first dielectric layer comprises borosilicate glass.

7. The method as defined by claim 5 wherein said second dielectric layer comprises borophosphosilicate glass.

8. The method as defined by claim 5 wherein said second reflow temperature is approximately 920° C.

9. The method as defined by claim 5 wherein said second dielectric layer is removed by a wet etch.

10. The method as defined by claim 5 wherein said first dielectric layer is removed by a plasma etch.

11. The method as defined by claim 5 wherein said first and second dielectric layer are permeable by hydrogen.

12. The method as defined by claim 5 wherein said conductive layer is comprised of metal.

13. A method for forming contacts on a semiconductor body having a thermal oxide layer formed thereon, the contacts embedded in a contact opening having a sloped two step profile, said method comprising the steps of:
   forming a first dielectric layer on said thermal oxide layer, said first dielectric layer having a first reflow temperature and a first etch rate;
   forming a second dielectric layer on said first dielectric layer, said second dielectric layer having a second reflow temperature and a second etch rate, said second reflow temperature lower than said first reflow temperature, said second etch rate higher than said first etch rate;
   heating said body to said second reflow temperature;
   forming a photoresist mask layer on said second dielectric layer;
   defining openings in said mask layer to expose said second dielectric layer utilizing a photolithographic means;
   removing said exposed portions of said second dielectric layer to expose said first dielectric layer by an isotropic etching process;
   removing said exposed portions of said first dielectric layer to expose said body to an anisotropic etching process;
   removing said mask layer;
   heating said body to said second reflux temperature;
   forming a conductive layer on said exposed portions of said body;
   whereby an improved contact is realized.

14. The method as defined by claim 13 wherein said first dielectric layer comprises borosilicate glass.

15. The method as described by claim 13 wherein said second dielectric layer comprises borophosphosiliate glass.

16. A method of forming contacts on a semiconductor body, having a layer of thermal oxide formed thereon, said method comprises the steps of:
   forming a first glass layer on said body, said first glass layer comprises borosilicate glass;
   forming a second glass layer on said first glass layer, said second glass layer comprising borophosphosilicate glass;
   heating said body to a temperature at which said second glass layer will reflow;
   forming a photoresist mask layer on said second glass layer;
   defining openings in said mask layer to expose said second glass layer utilizing a photolithographic means;
   removing said exposed portions of said second glass layer to expose said first glass layer by an isotropic etching process; removing said exposed portions of said first glass layer and portions of said thermal oxide layer underlying said exposed portions of said first glass layer to expose said body by an anisotropic etching process;
   removing said mask layer;
   heating said body to said reflow temperature of said second glass layer;
   forming a conductive layer on said exposed portions of said body;
   whereby the improved contact is utilized.

* * * * *

UNITED STATES PATENT AND TRADEMARK OFFICE
CERTIFICATE OF CORRECTION

PATENT NO. : 4,824,767

DATED : 4/25/89

INVENTOR(S) : Chambers et al.

It is certified that error in the above-identified patent and that said Letters Patent is hereby corrected as shown below:

| | | |
|---|---|---|
| col. 03, line 08 | after "application" | delete "in" |
| col. 06, line 23 | delete "reflux" | insert --reflow-- |
| col. 06, line 30 | delete "borophosphosiliate" | insert --borophosphosilicate-- |

Signed and Sealed this

Twelfth Day of February, 1991

*Attest:*

HARRY F. MANBECK, JR.

*Attesting Officer*  *Commissioner of Patents and Trademarks*

UNITED STATES PATENT AND TRADEMARK OFFICE
CERTIFICATE OF CORRECTION

PATENT NO. : 4,824,767
DATED : April 25, 1989
INVENTOR(S) : Chambers, et al.

It is certified that error appears in the above—identified patent and that said Letters Patent is hereby corrected as shown below: ON TITLE PAGE:

ASSIGNEE: should read

[73]     Assignee:   Intel Corporation, Santa Clara, California
                     International Business Machines, Armonk,
                     New York Signed and Sealed this Second Day of June, 1992

*Attest:*

DOUGLAS B. COMER

*Attesting Officer*     *Acting Commissioner of Patents and Trademarks*